United States Patent
Koshimizu

(10) Patent No.: US 11,664,196 B2
(45) Date of Patent: May 30, 2023

(54) DETECTING METHOD AND PLASMA PROCESSING APPARATUS

(71) Applicant: TOKYO ELECTRON LIMITED, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 69 days.

(21) Appl. No.: 17/194,393

(22) Filed: Mar. 8, 2021

(65) Prior Publication Data

US 2021/0296092 A1 Sep. 23, 2021

(30) Foreign Application Priority Data

Mar. 17, 2020 (JP) .............................. JP2020-046611

(51) Int. Cl.
*H01J 37/32* (2006.01)

(52) U.S. Cl.
CPC .. *H01J 37/32128* (2013.01); *H01J 37/32183* (2013.01); *H01J 37/32935* (2013.01)

(58) Field of Classification Search
CPC ........... H01J 37/32183; H01J 37/32963; H01J 2237/334; H01J 37/32082; H01J 37/32137; H01J 37/32532; H01J 2237/04; H01J 37/08; H01J 37/244; H01J 37/32009; H01J 37/32091; H01J 37/32146; H01J 37/32165; H01J 37/32935; H01J 37/32944; H01J 37/3299; H01J 2237/0206; H01J 37/32128; H01J 37/32706; H01L 21/3065; H01L 22/26; H01L 21/67069; H01L 21/67253; H01L 27/1446; H01L 27/14603; H01L 27/14658; H01L 27/14812; H01L 21/02002; H01L 21/02104; H01L 21/67259; H01L 27/0251; H01L 27/1225; H01L 27/124; H01L 27/1248; H01L 27/1255; H01L 29/78648; H01L 29/7869; H01L 29/78696

See application file for complete search history.

(56) References Cited

U.S. PATENT DOCUMENTS

| | | | |
|---|---|---|---|
| 2016/0079037 A1* | 3/2016 | Hirano | H01J 37/32183 156/345.28 |
| 2016/0111261 A1* | 4/2016 | Kabouzi | H01J 37/32532 438/10 |
| 2018/0076231 A1* | 3/2018 | Yamazaki | G09G 3/3648 |
| 2018/0277377 A1* | 9/2018 | Eto | H01J 37/32009 |

FOREIGN PATENT DOCUMENTS

| | | |
|---|---|---|
| JP | H09-115883 A | 5/1997 |
| JP | H11-288921 A | 10/1999 |

* cited by examiner

*Primary Examiner* — Monica C King
(74) *Attorney, Agent, or Firm* — Weihrouch IP

(57) ABSTRACT

A detecting method includes: supplying a bias power to a lower electrode, and supplying a source power to an upper electrode or the lower electrode; and detecting an output value of a sensor attached to a chamber. The detecting the output value of the sensor includes (a) specifying a first phase of a bias waveform for each cycle of the bias waveform, (b) specifying a second phase of a source waveform after a predetermined first time elapses from a timing when the first phase is specified, and (c) sampling the output value of the sensor after a predetermined second time elapses from a timing when the second phase is specified. The steps (a) to (c) are repeated for each cycle of the bias waveform.

15 Claims, 6 Drawing Sheets

DETECTING METHOD AND PLASMA PROCESSING APPARATUS

CROSS-REFERENCE TO RELATED APPLICATIONS

This application is based on and claims priority from Japanese Patent Application No. 2020-046611, filed on Mar. 17, 2020, with the Japan Patent Office, the disclosure of which is incorporated herein in its entirety by reference.

TECHNICAL FIELD

The present disclosure relates to a detecting method and a plasma processing apparatus.

BACKGROUND

Japanese Patent Laid-Open Publication Nos. 11-288921 and 09-115883 propose detecting light of a predetermined wavelength emitted from plasma, detecting an end point of a plasma processing based on the change in the light emission intensity of a signal extracted from the detected light of the predetermined wavelength, and ending the processing of a substrate.

SUMMARY

According to an aspect of the present disclosure, a detecting method includes: supplying a bias power to a lower electrode, and supplying a source power to an upper electrode or the lower electrode; and detecting an output value of a sensor attached to a chamber. The detecting the output value of the sensor includes (a) specifying a first phase of a bias waveform for each cycle of the bias waveform, (b) specifying a second phase of a source waveform after a predetermined first time elapses from a timing when the first phase is specified, and (c) sampling the output value of the sensor after a predetermined second time elapses from a timing when the second phase is specified. The steps (a) to (c) are repeated for each cycle of the bias waveform.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
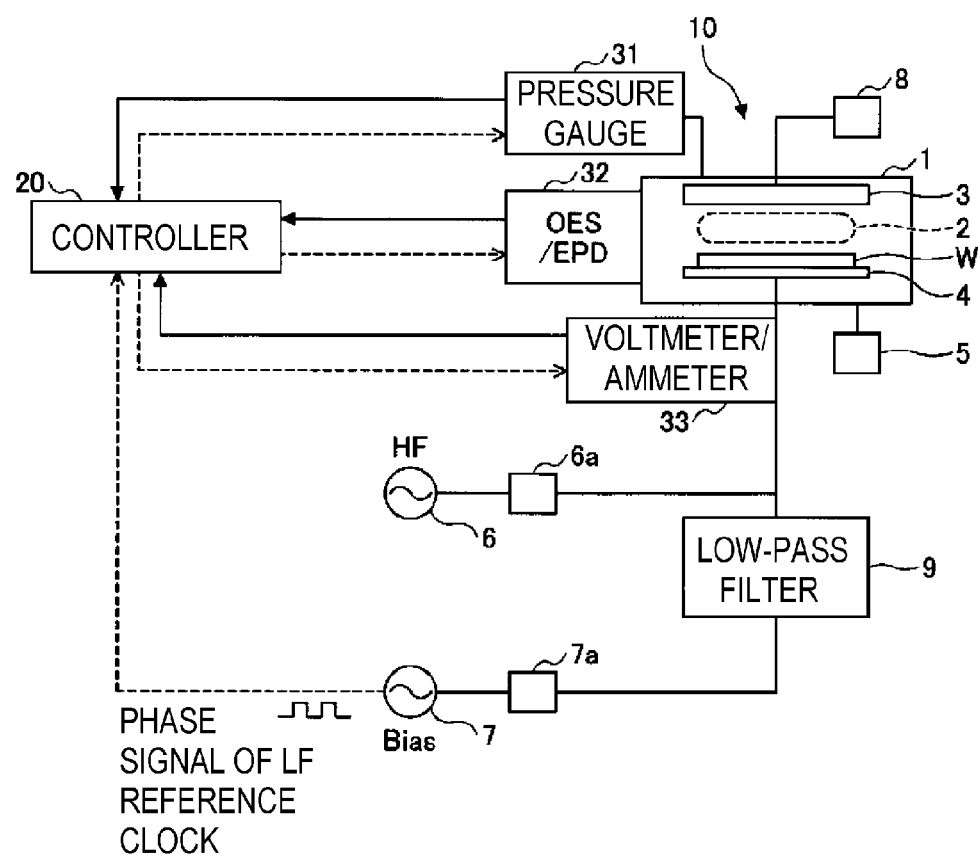
FIG. 1 is a schematic cross-sectional view illustrating a plasma processing apparatus according to first and second embodiments.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments for implementing the present disclosure will be described with reference to the drawings. In the respective drawings, the same components will be denoted by the same reference numerals, and overlapping descriptions thereof may be omitted.

[Plasma Processing Apparatus]

A configuration of a plasma processing apparatus 10 that performs a substrate processing such as an etching or a film formation will be described with reference to FIG. 1. FIG. 1 is a schematic cross-sectional view illustrating the plasma processing apparatus 10 according to first and second embodiments. The plasma processing apparatus 10 is an example of some plasma generating systems used for exciting plasma from a processing gas.

The plasma processing apparatus 10 is a capacitively coupled plasma (CCP) apparatus in which plasma 2 is formed between an upper electrode 3 and a lower electrode 4 inside a chamber 1. The lower electrode 4 also functions as a stage for placing a substrate W thereon. A first radio-frequency power supply 6 and a second radio-frequency power supply 7 are connected to the lower electrode 4. The first radio-frequency power supply 6 is connected to the lower electrode 4 via a matching unit 6a. The second radio-frequency power supply 7 is connected to the lower electrode 4 via a matching unit 7a. The first radio-frequency power supply 6 is a radio-frequency power supply for generating plasma, and the second radio-frequency power supply 7 is a bias radio-frequency power supply for drawing ions to the substrate W. The first radio-frequency power supply 6 outputs a first radio-frequency power (HF power), and the second radio-frequency power supply 7 outputs a second radio-frequency power (LF power). The frequency of the LF power is lower than the frequency of the HF power. For example, the frequency of the first radio-frequency power supply 6 may be 40 MHz to 100 MHz, and the frequency of the second radio-frequency power supply 7 may be 200 kHz to 13.56 MHz. A low-pass filter 9 is provided between the first radio-frequency power supply 6 and the second radio-frequency power supply 7 in order to prevent the HF power from flowing into the second radio-frequency power supply. Instead of the second radio-frequency power supply, a DC pulse power supply may be used. The power output from the second radio-frequency power supply or the DC pulse power supply will be referred to as a bias power. The HF power output from the first radio-frequency power supply 6 will be referred to as a source power. The first radio-frequency voltage based on the first radio-frequency power supply will be referred to as an HF voltage, and the first radio-frequency current based on the first radio-frequency power supply will be referred to as an HF current. The second radio-frequency voltage based on the second radio-frequency power supply will be referred to as an LF voltage, and the second radio-frequency current based on the second radio-frequency power supply will be referred to as an LF current.

The matching unit 6a matches the impedance of a load side to the output impedance of the first radio-frequency power supply 6. The matching unit 7a matches the impedance of a load side to the output impedance of the second radio-frequency power supply 7.

A gas supply 8 is connected to the chamber 1 to supply a processing gas. An exhaust device 5 is connected to the chamber 1 to exhaust the inside of the chamber 1.

The plasma processing apparatus 10 of FIG. 1 includes a controller 20 that includes a processor and a memory, and the controller 20 controls each component of the plasma processing apparatus 10 to process the substrate W with plasma. A voltmeter/ammeter 33 is attached to a power feeding rod connected to the first radio-frequency power supply 6 and the second radio-frequency power supply 7. The voltmeter/ammeter 33 transmits a measured HF voltage or current, a measured LF voltage or current, a measured phase signal of an HF voltage or current, or a measured phase signal of an LF voltage or current, to the controller 20. The controller 20 acquires all or a portion of the HF voltage or current, the LF voltage or current, the phase signal of the HF voltage or current, and the phase signal of the LF voltage or current from the voltmeter/ammeter 33. The waveform of the LF voltage or current is an example of a bias waveform. Examples of the bias waveform include a tailored waveform which is a DC pulse voltage waveform including a tailored form, in addition to the LF voltage waveform (bias waveform) in the upper figure of FIG. 3 and the DC pulse voltage waveform (bias waveform) in the upper figure of FIG. 4. The controller 20 may acquire the bias waveform itself or a phase signal of the bias waveform as a signal of the bias waveform. Further, the controller 20 may acquire the source waveform itself or a phase signal of the source waveform as a signal of the source waveform. The waveform of the HF voltage or current is an example of the source waveform.

A light emission spectroscopic analyzer (OES/EPD) 32 is attached to the window of the chamber 1 to measure the light emission intensity. The signal of the measured light emission intensity is transmitted from the light emission spectroscopic analyzer 32 to the controller 20. The controller 20 acquires the signal of the light emission intensity of plasma in the chamber 1 from the light emission spectroscopic analyzer 32. The signal of the light emission intensity is an example of an output value of a sensor.

A pressure gauge 31 is attached to the chamber 1 to measure the pressure in the chamber 1. A signal of the measured pressure is transmitted from the pressure gauge 31 to the controller 20. The controller 20 acquires the signal of the pressure in the chamber 1 from the pressure gauge 31. The signal of the pressure is an example of an output value of a sensor. In this case, the sensor is the pressure gauge 31. While examples of the sensor may include the voltmeter, the ammeter, the light emission spectroscopic analyzer, and the pressure gauge that are attached to the power feeding line, the type of the sensor may not be limited thereto. For example, the sensor includes any sensor capable of detecting the state of plasma, the state of a process, and the state of the plasma processing apparatus 10 and components thereof, such as a temperature sensor or a CCD sensor.

The second radio-frequency power supply 7 transmits a phase signal of the LF voltage or current and a reference clock as the signal of the bias to the controller 20. The controller 20 receives the phase signal of the LF voltage or current and the reference clock as the signal of the bias. Based on the phase signal of the LF voltage or current and the reference clock, the controller 20 controls a timing for performing a sampling by each sensor (e.g., the pressure gauge 31) according to the cycle of the bias or a specific phase of the bias. The reference clock is a clock synchronized with the cycle of the bias. The controller 20 may receive the signal of the bias waveform, the phase signal of the bias, and an A/D-converted signal of the bias waveform, as the signal of the bias.

With the high-integration of devices, a finer processing is required for a process performed on the substrate W by the plasma processing apparatus 10. Hence, there is a demand for the high sensitivity and accuracy of the sensor attached to the chamber 1 to monitor, for example, the state of plasma during a processing of the substrate W, the state of a process, and the state of the processing apparatus 10 and components thereof.

Values detected by sensors, that is, output values of sensors that represent the state of plasma, the state of a process, the state of the plasma processing apparatus 10 and components thereof include Vpp, Vdc, a plasma electron density, an electron density distribution inside a chamber, an ion flux distribution, an ion energy distribution, a plasma electron temperature, and a light emission intensity or a light absorption amount of various ions or radicals in plasma. The output values of sensors are detection values detected by various detectors attached to the chamber or the apparatus, such as a voltage value or a current value of the power feeding line, a pressure value in the chamber 1, and a temperature value of the substrate W.

Compared with the progress of the fine processing of the substrate W, the progress of the sensitivity, accuracy, and stability of sensors is slow. For example, in the end point detection (EPD), there is a demand for a small change in plasma or in light emission intensity when the end point is detected, and an improvement of the S/N ratio, that is, a reduction of noise included in a signal of a sensor (an output value of a signal).

In the detecting method and the plasma processing apparatus 10 according to the embodiments, the S/N ratio is improved when at least one of the state of plasma, the state of a process, and the state of the plasma processing apparatus 10 and components thereof is monitored by output values of a sensor, so that the accuracy of the monitor is improved.

Figure 3:
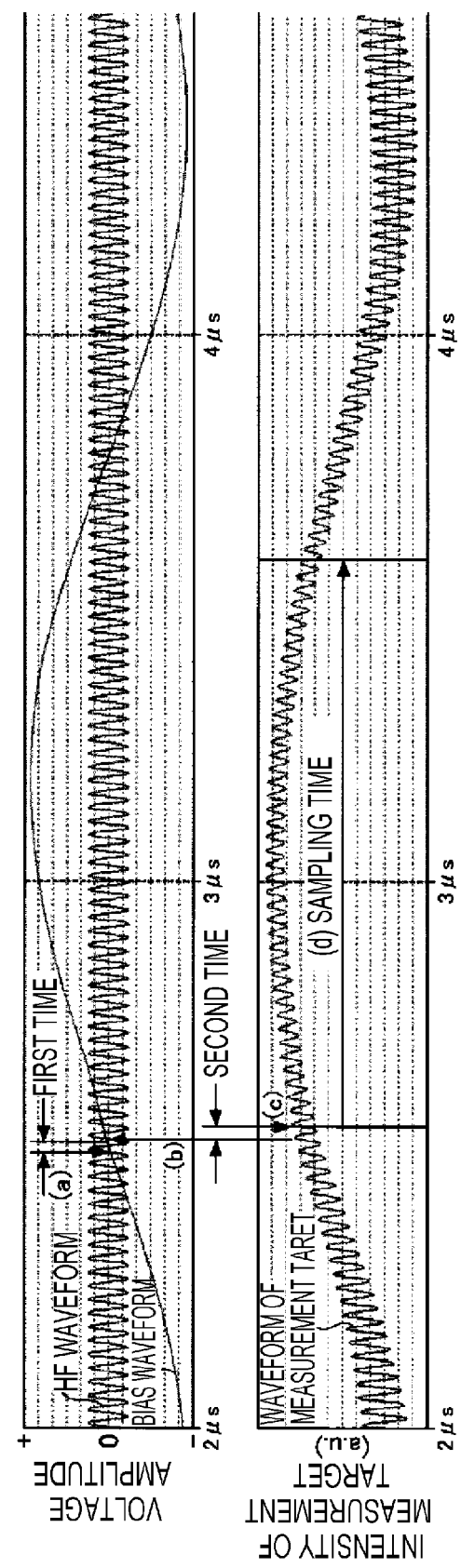
FIG. 3 is a view illustrating an example of a simulation result for a detecting method according to the second embodiment.
Figure 4:
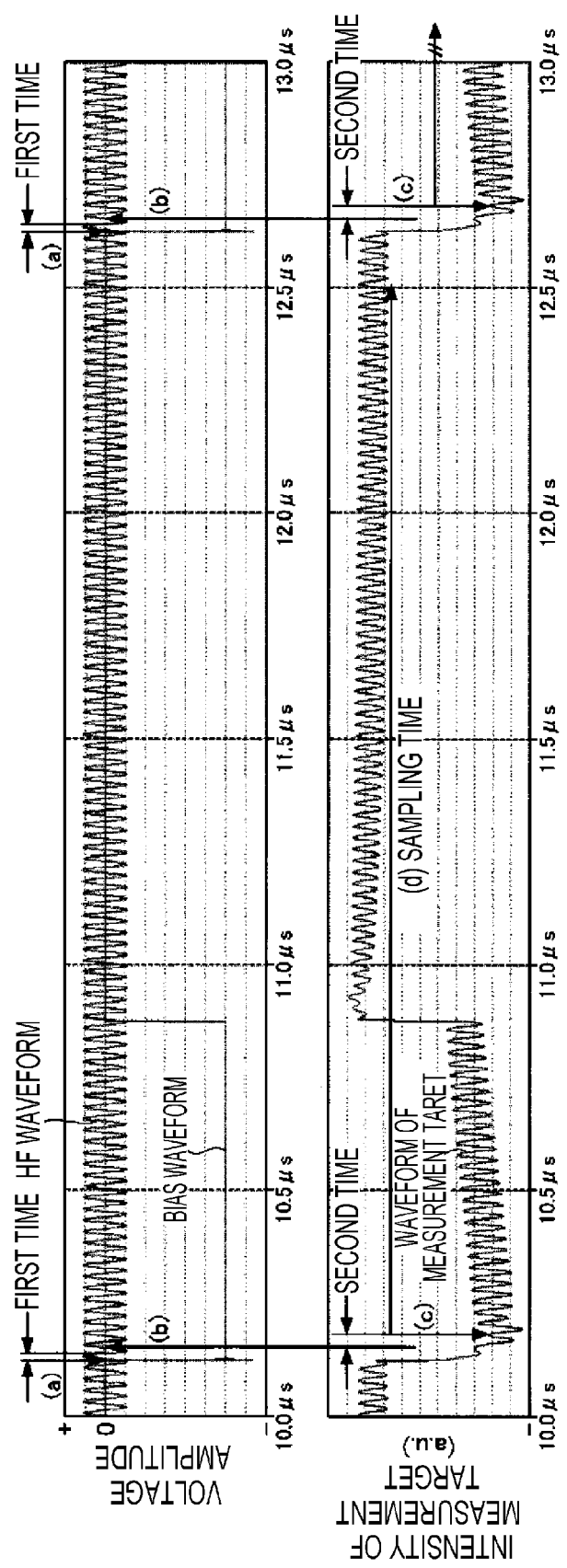
FIG. 4 is a view illustrating another example of the simulation result for the detecting method according to the second embodiment.

When the voltage amplitude of the bias waveform signal (see, e.g., FIGS. 3 and 4) fluctuates with time, the voltage of the substrate fluctuates along with the fluctuation of the amplitudes of the bias waveform signal and the HF voltage waveform. The bias waveform signal of FIG. 3 is a signal when the second radio-frequency power supply is used, and the bias waveform signal of FIG. 4 is a signal when the DC pulse power supply is used. In particular, when the bias power and the source power are applied to the same lower electrode 4 during the plasma processing, the thickness of the ion sheath on the lower electrode 4 changes at the phase of the bias waveform signal.

As a result, the impedance of the radio-frequency current that flows out from the lower electrode 4 into the plasma when the HF power is applied changes with the phase of the bias waveform (e.g., the phase of the LF voltage or current). As a result, the input power or the reflected power of the HF power with respect to the plasma changes at the phase of the bias waveform. That is, the state of the plasma 2 and the state of the process in the chamber 1 that appear to be constant are fluctuating along with the cycle of the bias waveform.

In the related art, monitors detect sensor output values that fluctuate along with the cycle of the bias, such as Vpp, Vdc, a plasma electron density, a plasma electron distribution, a plasma electron temperature, a light emission intensity of plasma, and the pressure in chamber 1, in synchronization with a reference clock which is another time interval without considering the cycle of the bias waveform.

In the detecting method according to each embodiment to be described herein below, sensor output values from monitors that detect, for example, the state of plasma and the state of a process are detected in synchronization with the phase of the bias waveform. That is, sensor output values are detected in synchronization with the phase of the bias waveform, using the cycle of the bias waveform as a reference clock. As a result, the components that fluctuate with the phase of the bias waveform, that is, the noise of sensor output values is removed, so that the sensor output values may be stabilized. As a result, the S/N ratio is improved so that the accuracy of the monitoring by a sensor that senses at least one of the state of plasma, the state of a process, and the state of the plasma processing apparatus 10 and components thereof may be improved.

First Embodiment

In a detecting method according to a first embodiment, a first phase of the bias waveform is specified for each cycle of the bias waveform, and a sampling is performed by a sensor.

When the bias waveform fluctuates periodically, a physical quantity that represents at least one of the state of plasma such as the light emission intensity of plasma, the state of a process, and the state of the plasma processing apparatus 10 and components thereof fluctuates along with the periodic fluctuation of the bias waveform. Accordingly, the sampling is performed in synchronization with the bias. Specifically, in the first embodiment, the sampling of sensor output values is performed after a predetermined first time elapses from the timing when the first phase of the bias waveform is specified for each cycle of the bias waveform. Accordingly, the sampling cycle of sensor output values is synchronized with a timing after the predetermined first time elapses from a specific timing for each cycle of the bias waveform, that is, the timing when the first phase of the bias waveform is specified, in order not to be affected by the periodic fluctuation of the bias waveform. As a result, output values of a sensor that detects an arbitrary physical quantity may be stably obtained without being affected by the fluctuation of the physical quantity along with the fluctuation of the bias waveform.

As to the "sampling," when the sampling may be performed at a sufficiently high speed for the cycle of the bias waveform, the sampling of sensor output values may be started immediately after the elapse of the first time. Alternatively, among continuously acquired data, data in a specified range before and after a timing immediately after the elapse of the first time may be validated. When the sampling may not be performed at a sufficiently high speed for the cycle of the bias waveform, the sampling of sensor output values may be started at a timing when the sampling of sensor output values is possible after the first time elapses. For an A/D converter of a frequency equal to about the bias frequency, the sampling is performed in accordance with the phase of the bias, such as performing the sampling once for one cycle of the bias or performing the sampling once for several cycles of the bias.

As illustrated in FIG. 1, the controller 20 receives the signal of the bias waveform (e.g., the phase signal of the LF voltage or current) and the reference clock signal.

When the sensor performs the A/D conversion, the controller 20 transmits a signal indicating the first phase specified for each cycle of the bias waveform to the sensor, based on the received bias waveform signal and reference clock signal. Based on the received signals, the sensor performs the sampling of sensor output values after the predetermined first time elapses from the timing when the first phase of the bias waveform is specified. The sensor performs the sampling of sensor output values for a predetermined sampling time, and transmits the sampled sensor output values to the controller 20. The controller 20 may output the sensor output values acquired by the detecting method as they are, or may smooth, and then, output the sensor output values.

The smoothing of the sensor output values may be performed by any method such as an analog or digital filter as long as the desired purpose is achieved. A filter may be applied to extract the frequency required for the sampled sensor output values, or may be applied to extract the frequency required for the sensor output values that have not been sampled.

When the controller performs the A/D conversion, the controller 20 inputs the smoothed sensor output values to the A/D converter to perform the A/D conversion. The A/D converter may be provided inside the controller 20, or may be provided outside the controller 20, furthermore, inside the sensor. The controller 20 may take a moving average of the sensor output values acquired for each cycle of the bias waveform, and output the obtained value as a sensor output value. The moving average of the sensor output values may be calculated based on sensor output values sampled over multiple cycles. One sensor value detected after the first time elapses from the timing when the first phase of the bias waveform is specified may be used as a sensor output value. In this case, one sampled sensor value exists for each cycle of the bias waveform. By optimizing the sampling time and/or smoothing the sensor output values, the S/N ratio is improved, and stable sensor output values may be acquired.

A signal obtained by A/D converting the sensor output values with the A/D converter may be input to the controller 20. The controller 20 may use the A/D-converted signal received as the signal of the bias waveform, to transmit the signal that represents the first phase specified for each cycle of the bias waveform to the sensor. Then, the sampling of sensor output values may be performed after the first time elapses from the specified first phase of the bias waveform. The sensor output values acquired from the sensor by the above-described detecting method may be smoothed.

Among the sensor output values acquired by the process described above, the sensor output values acquired within cycles that correspond to an integral multiple (n: n≥1) of one cycle of the bias waveform may be averaged, and the averaged sensor output value may be output. For example, when n=5, the sensor output values sampled for five cycles of the bias waveform may be averaged.

Figure 2A:
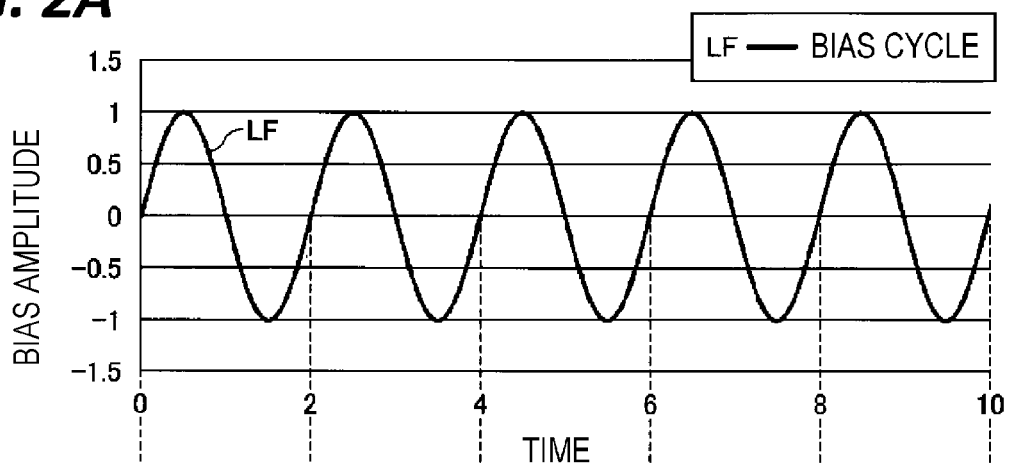
FIGS. 2A and 2B are views illustrating an example of a simulation result for a detecting method according to the first embodiment.
Figure 2B:
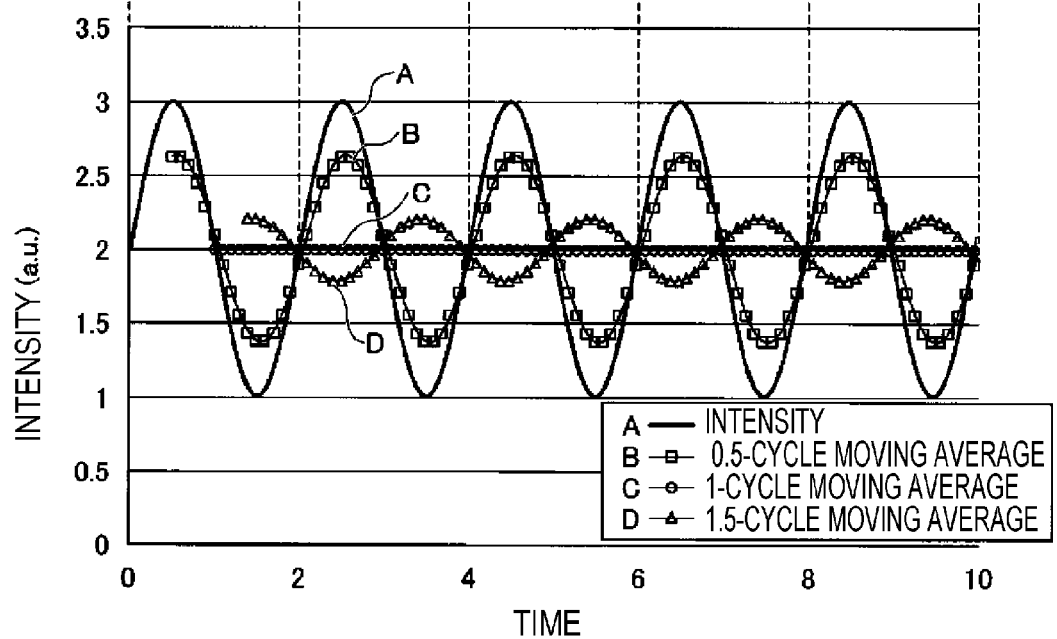

FIGS. 2A and 2B are views illustrating an example of a simulation result for the detecting method according to the first embodiment. In FIG. 2A, the horizontal axis represents time, and the vertical axis represents the voltage amplitude of the bias waveform. FIG. 2A represents the LF voltage waveform as the bias waveform. In FIG. 2B, the horizontal axis represents time, and the vertical axis represents a simulation result for the intensity of a certain physical quantity affected by the bias.

The intensity A fluctuates in synchronization with the phase of the bias waveform. This is because the thickness of the ion sheath on the lower electrode 4 changes along with the phase of the bias waveform, and as a result, the impedance of the radio-frequency current that flows out from the lower electrode 4 into plasma when the HF power is applied changes. When the impedance of the radio-frequency current changes, the input power or the reflected power of the HF power with respect to the plasma changes periodically, and as a result, the intensity A fluctuates periodically in synchronization with the phase of the bias.

When the intensity A may be sampled at a frequency of a higher-digit number than the frequency of the bias waveform, the fluctuation of the intensity may be substantially accurately measured, so that so-called aliasing noise does not occur. However, when the frequency of the bias waveform increases, it becomes difficult to sample the intensity at the frequency of the higher-digit number than the frequency of the bias waveform due to the delay in measurement time of the sensor, and the aliasing noise occurs. Accordingly, the detecting method according to the first embodiment proposes a method of suppressing the occurrence of the aliasing noise by implementing a practical sampling rate.

The one-cycle moving average C illustrated in FIG. 2B is a simulation result for the moving average of one cycle of the intensity of a certain physical quantity affected by the bias.

As comparative examples, B and D represent the intensities when the moving average is simulated for cycles that do not correspond to an integral multiple of the cycle of the bias waveform.

In the 0.5-cycle moving average B in which the moving average of the intensity is obtained in a cycle 0.5 times the bias waveform, the intensity fluctuates with the elapse of time, and the sensor output values fluctuate along with the fluctuation of the bias waveform. Similarly, in the 1.5-cycle moving average D in which the moving average of the intensity is obtained in a cycle 1.5 times the bias waveform, an improvement is found over the 0.5-cycle moving average B. However, the intensity fluctuates with the elapse of time, and the sensor output values fluctuate along with the fluctuation of the bias waveform.

Meanwhile, in the one-cycle moving average C, the fluctuation along with the fluctuation of the bias waveform does not occur. Thus, in the detecting method according to the first embodiment, the fluctuation of the sensor output values based on the periodic fluctuation of the bias waveform may be smoothed, and stable sensor output values may be obtained.

Second Embodiment

In a detecting method according to a second embodiment, the sensor performs the sampling according to the phase of the bias waveform and the phase of the HF voltage waveform.

Hereinafter, referring to FIG. 3, descriptions will be made on a simulation result for the detecting method according to the second embodiment, which uses not only the first phase of the bias waveform but also a second phase of the HF voltage waveform. FIG. 3 is a view illustrating an example of the detecting method of the second embodiment.

The detecting method according to the second embodiment includes a step of supplying the bias power to the lower electrode 4 and supplying the source power to the upper electrode or the lower electrode 4, and a step of detecting output values of the sensor attached to the chamber 1. The detecting method according to the second embodiment is different from the detecting method according to the first embodiment in that the step of detecting output values of the sensor includes steps (a) to (c) described below.

In the detecting method according to the second embodiment, the step of detecting output values of the sensor includes (a) specifying the first phase of the bias waveform for each cycle of the bias waveform, (b) specifying a second phase of the source waveform after the predetermined first time elapses from the timing when the first phase is specified, and (c) sampling output values of the sensor after a predetermined second time elapses from the timing when the second phase is specified. The steps (a) to (c) are repeated for each period of the bias waveform.

In the upper figure of FIG. 3, the horizontal axis represents time, and the vertical axis represents the voltage amplitudes of the bias waveform and the HF waveform. In the lower figure of FIG. 3, the horizontal axis represents time, and the vertical axis represents sensor output values (the voltage of the substrate in plasma in FIGS. 3 and 4) measured by a sensor of a measurement target (a probe for measuring the voltage of the substrate in plasma in FIGS. 3 and 4).

The (a) to (c) illustrated in FIG. 3 correspond to the steps (a) to (c) of the detecting method according to the second embodiment. Specifically, (a) illustrated in FIG. 3 represents an example of the timing specified by the step of specifying the first phase of the bias waveform for each cycle of the bias waveform. In the example of FIG. 3, the timing of the voltage 0 when the bias waveform changes from a negative value to a positive value is specified as the first phase of the bias waveform for each cycle of the bias waveform. This timing is indicated by the arrow of (a) of FIG. 3.

The (b) illustrated in FIG. 3 represents an example of the timing specified by the step of specifying the second phase of the HF voltage waveform after the predetermined first time elapses from the timing indicated by the arrow of (a) of FIG. 3, that is, the timing when the first phase is specified. In the example of FIG. 3, the timing of the voltage 0 when the HF voltage waveform changes from a negative value to a positive value after the first time elapses from the timing when the first phase is specified is specified as the second phase of the HF voltage waveform. This timing is indicated by the arrow of (b) of FIG. 3.

The (c) illustrated in FIG. 3 represents an example of the timing specified by the step of sampling the sensor output values after the predetermined second time elapses from the timing when the second phase is specified. In the example of FIG. 3, the timing after the second time elapses from the timing when the second phase is specified is specified as the timing for sampling the intensity of the measurement target. This timing is indicated by the arrow of (c) of FIG. 3.

In the detecting method according to the second embodiment, the steps (a) to (c) are repeated for each cycle of the bias waveform. The time for sampling sensor output values from the timing when the sampling is started is predetermined. Then, in a step (d), the sensor output values of the predetermined sampling time are acquired after the sensor output values are sampled in the step (c). The steps (a) to (d) are repeated for each cycle of the bias waveform.

The controller 20 controls specifying the first phase by outputting a trigger signal when the signal of the bias waveform changes from 0 to 1. The controller 20 controls specifying the second phase by outputting a trigger signal when the signal of the HF voltage waveform (source waveform) changes from 0 to 1. Further, the controller 20 counts the first time, the second time, and the sampling time using a delay timer, and controls the steps (a) to (d).

The first phase and the second phase to be specified are not limited to the timing of the voltage 0 when each waveform changes from a negative value to a positive value. The first phase and the second phase to be specified may be the timing of the voltage 0 when each waveform changes from a positive value to a negative value, or may be the maximum or minimum value of the voltage amplitude of each waveform. Further, the first phase and the second phase may be specified based on the same reference or different references.

The second time is a value of 0 or more, and may be a value within one cycle of the source waveform. The second time may be preset to a time when the sensor is able to start outputting the sensor values after the second phase is specified. The first time may be a value of 0 or more, and may be a value within one cycle of the bias waveform. The first time may be the same as or different from the second time.

The sampling time is a predetermined time, and may be a time from the first phase until all sensor output values of the cycle that corresponds to the phase are sampled, a relatively shorter given time, or a time including a time of a relatively longer subsequent cycle.

In the detecting method according to the second embodiment, the sampled sensor output values may be smoothed and output. As described above, a moving average of the sampled sensor output values may be obtained. The controller 20 sample-holds the sensor output values of the sampling time using the A/D converter, and performs the A/D conversion of the sample-held sensor output values for digitization. The sample-holding indicates that the A/D converter holds sensor output values that correspond to a certain phase for each certain time when a signal that instructs a certain A/D conversion is received.

The detecting method according to the second embodiment is not limited to smoothing the sensor output values, sampling the sensor output values in the range of the first phase for the cycle of the bias waveform, and A/D converting the sensor output values. For example, the smoothing is optional and may not be performed. The A/D conversion may be performed once for one cycle or multiple cycles of the bias waveform from the timing when the sampling is performed as illustrated in (c) of FIG. 3.

The sampling may not be performed for each cycle of the bias waveform. That is, the present disclosure is not limited to sampling the sensor output values in the range of the first phase for the cycle of the bias waveform, among the sensor output values. For example, multiple cycles of the bias waveform may be set as one unit, such that the sensor output values in a specific cycle of the multiple cycles may be sampled, and the sensor output values in the other cycles may not be sampled. In this case as well, the timing for sampling the sensor output values once for one cycle of the bias waveform is determined by the steps (a) to (c), or sampled data of the sensor output values are validated by the following steps (a) to (c).

That is, the step of detecting the sensor output values may include:

(a) a step of specifying the first phase of the bias waveform for each cycle of the bias waveform;

(b) a step of specifying the second phase of the source waveform after the predetermined first time elapses from the timing when the first phase is specified; and (c) a step of validating sampled data of the sensor output values after the predetermined second time elapses from the timing when the second phase is specified. The steps (a) to (c) may be repeated for each cycle of the bias waveform.

The step of detecting the sensor output values may further include:

(d) a step of acquiring the sensor output values of the predetermined sampling time, after the sampled data of the sensor output values are validated. The steps (a) to (d) may be repeated for each cycle of the bias waveform.

Similarly, when the sampled data of the sensor output values are validated, the sensor output values for a specific cycle of the multiple cycles among the sensor output values may be sampled, and the sensor output values for the other cycles may not be sampled.

The state of plasma such as light emission changes in synchronization with the phase of the bias. This is because the thickness of the ion sheath on the lower electrode 4 changes according to the phase of the bias, and the impedance of the HF changes, so that the input power or the reflected power of the HF power with respect to the plasma changes periodically.

In the detecting method according to the second embodiment, as illustrated in FIG. 1, the controller 20 receives the signal of the bias waveform (the phase signal of the LF voltage) and the reference clock signal. Based on the received bias waveform signal (the phase signal of the LF voltage), the controller 20 specifies the first phase of the bias waveform and the second phase of the HF voltage waveform. Based on the specified first phase and second phase, the controller 20 controls the timing for performing the sampling of sensor output values, and acquires the sensor output values for the sampling time from the timing when the sampling is performed.

By repeating the steps (a) to (d) as described above, the timing for performing the sampling becomes consistent in each cycle, so that the sensor output values may be stably acquired without being affected by the fluctuation of the voltage amplitude of the bias waveform or the HF waveform along with time. As a result, the accuracy of the output values by the sensor may be improved, and the S/N ratio may be improved, that is, the noise included in the sensor output values may be reduced. Further, the accuracy of the monitor that detects the state of plasma, the state of a process, and the state of the plasma processing apparatus 10 and components thereof may be improved.

As for the bias, the DC pulse voltage illustrated in FIG. 4 may be used, instead of the LF voltage. FIG. 4 is a view illustrating another example of the simulation result for the detecting method according to the second embodiment. In FIG. 4, the DC pulse voltage waveform which is a binary pulse wave is used as the bias waveform, instead of the bias waveform (the LF voltage waveform) illustrated in FIG. 3.

In this case as well, the step of detecting the sensor output values includes (a) specifying the first phase of the bias waveform for each cycle of the bias waveform, (b) specifying the second phase of the source power after the predetermined first time elapses from the timing when the first phase is specified, and (c) sampling the sensor output values after the predetermined second time elapses from the timing when the second phase is specified. The steps (a) to (c) are repeated for each cycle of the bias waveform.

The (a) illustrated in FIG. 4 represents an example of the timing specified by the step of specifying the first phase of the bias waveform for each cycle of the bias waveform. In the example of FIG. 4, the timing when the bias waveform changes from the value of 0 to a negative value is specified as the first phase of the bias waveform for each cycle of the bias waveform. This timing is indicated by the arrow of (a) in FIG. 4.

The (b) illustrated in FIG. 4 represents an example of the timing specified by the step of specifying the second phase of the HF voltage waveform after the first time elapses from the timing indicated by the arrow of (a) of FIG. 4, that is, the timing when the first phase is specified. In the example of FIG. 4, the timing of the voltage 0 when the HF voltage waveform changes from a negative value to a positive value after the first time elapses from the timing when the first phase is specified is specified as the second phase of the HF voltage waveform. This timing is indicated by the arrow of (b) in FIG. 4.

The (c) illustrated in FIG. 4 represents an example of the timing specified by the step of sampling the sensor output values after the predetermined second time elapses from the timing when the second phase is specified. In the example of FIG. 4, a timing after the second time elapses from the timing when the second phase is specified is specified as the timing for sampling the intensity of the measurement target. This timing is indicated by the arrow of (c) in FIG. 4. In the step (d), the sensor output values of the predetermined sampling time are acquired, after the sensor output values are sampled in the step (c). Then, the steps (a) to (d) are repeated for cycle of the bias waveform.

Figure 5:
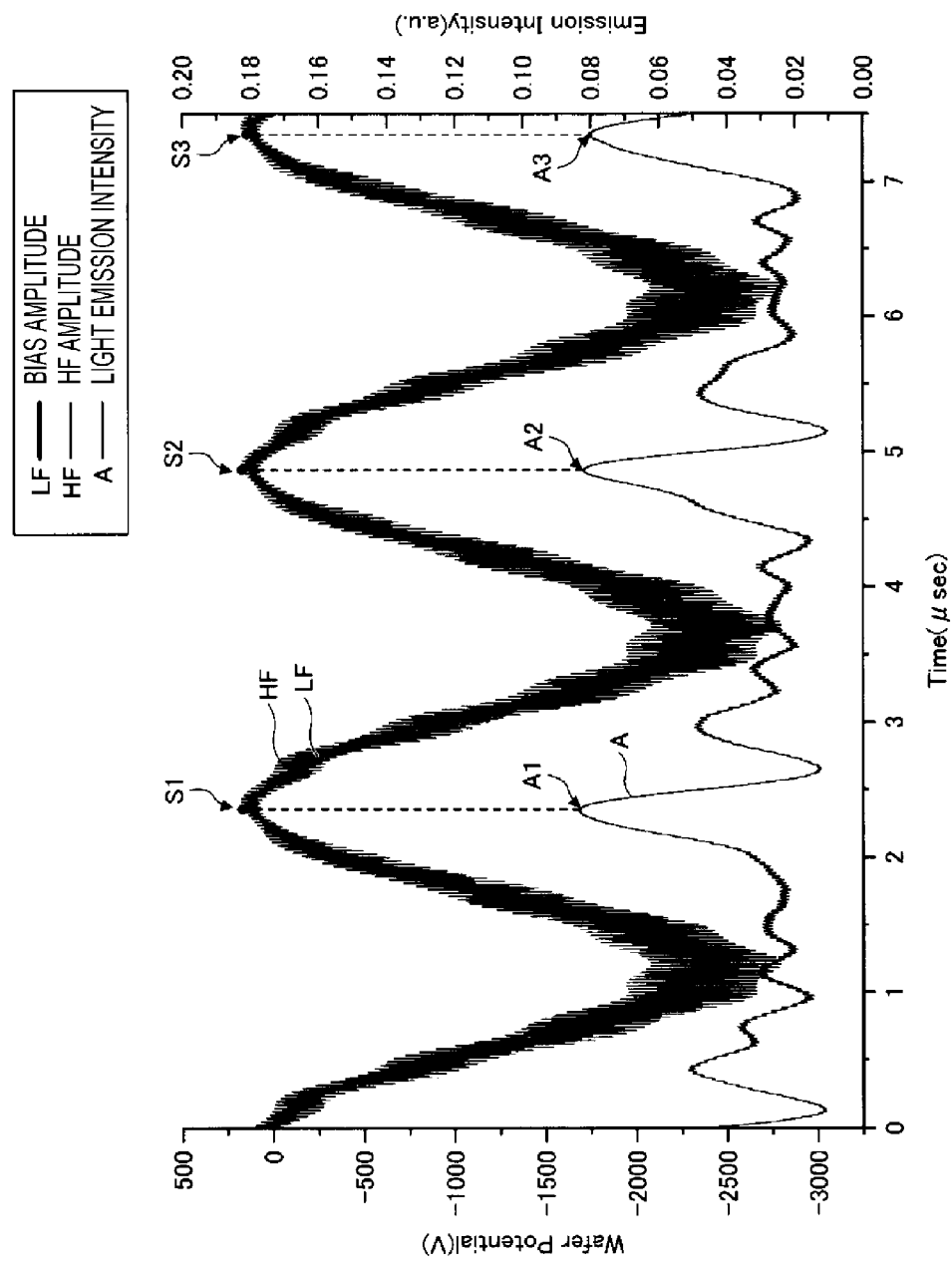
FIG. 5 is a view illustrating an example of a detection result of light emission intensity.

For example, FIG. 5 is a view illustrating an example of a detection result of the light emission intensity which is an example of the sensor output values. In FIG. 5, the horizontal axis represents time, and the vertical axis represents the potential of the substrate. The "LF" indicates the amplitude of the LF (RF) waveform as the amplitude of the bias waveform. The "HF" indicates the amplitude of the HF (RF) waveform as the amplitude of the source waveform. The "A" indicates the light emission intensity sampled using the detecting method according to the second embodiment.

According to the detection result, it may be found that by repeating the steps (a) to (d), the phase of the LF and the phase of the HF are consistent at the timings S1, S2, S3 . . . when the sampling is performed, so that stable sensor output values A1, A2, and A3 may be acquired. As described above, according to the detecting method according to the second embodiment, sensor output values may be sampled while stabilizing the component that fluctuates with both the phase of the bias waveform and the phase of the HF voltage waveform. As a result, the S/N ratio is improved so that the accuracy of the monitoring of the plasma state in the chamber 1 may be improved.

Figure 6A:
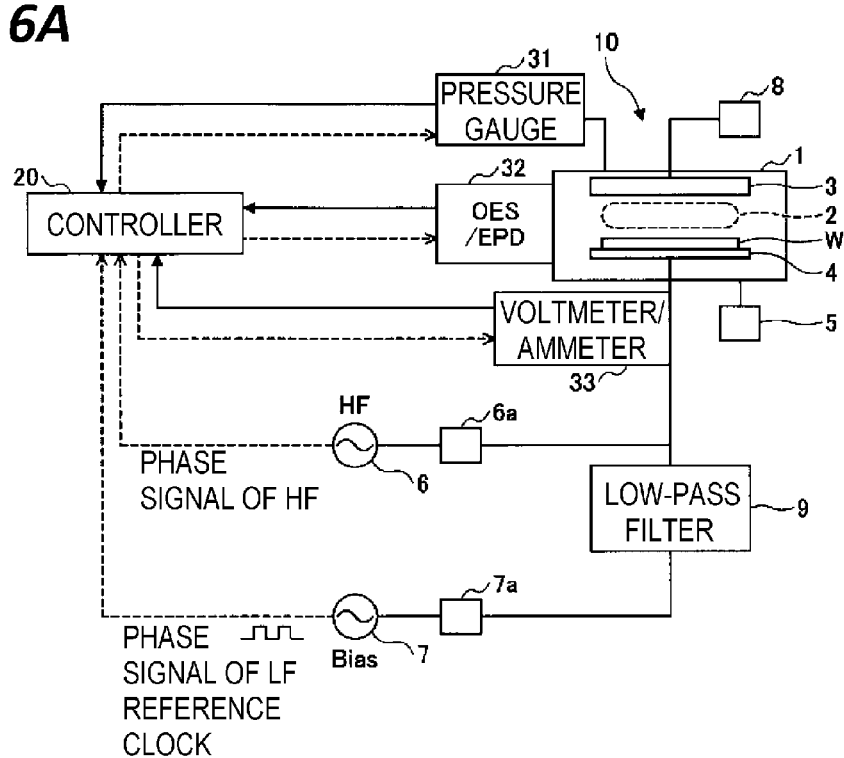
FIGS. 6A and 6B are schematic cross-sectional views illustrating the plasma processing apparatus according to the second embodiment.
Figure 6B:
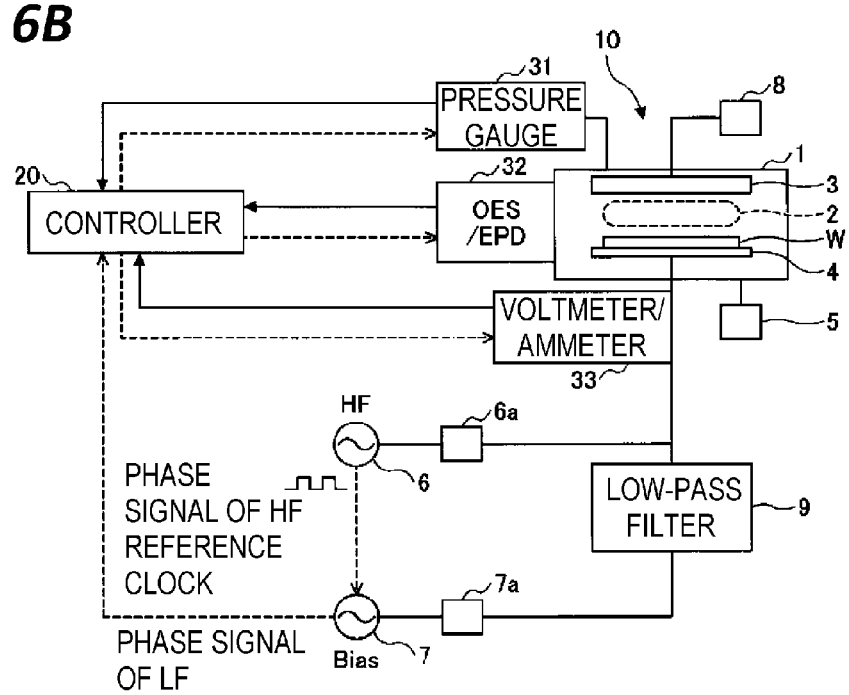

In order to implement the detecting method according to the second embodiment, the plasma processing apparatus 10 illustrated in FIGS. 6A and 6B is used. FIGS. 6A and 6B are schematic cross-sectional views illustrating the plasma processing apparatus 10 according to the second embodiment.

As illustrated in FIG. 6A, the controller 20 receives the signal of the bias voltage, the phase signal of the LF voltage, and the reference clock signal from the second radio-frequency power supply 7.

The controller 20 further receives the signal of the HF voltage and the phase signal of the HF voltage from the first radio-frequency power supply 6. Based on the signal of the bias voltage, the phase signal of the LF voltage, the reference clock signal, the signal of the HF voltage, and the phase signal of the HF voltage that have been received, the controller 20 transmits the signal that specifies the first phase and the signal that specifies the second phase to each sensor. Based on the received signals, each sensor (e.g., the pressure gauge 31, the OES/EPD 32, or the voltmeter/ammeter 33 in FIG. 6A) performs the sampling in the step (c), and transmits the sensor output values of the sampling time to the controller 20.

As illustrated in FIG. 6B, the signal of the HF voltage, the phase signal of the HF voltage, and the reference clock may be transmitted from the first radio-frequency power supply 6 to the second radio-frequency power supply 7, and the second radio-frequency power supply 7 may transmit the phase signal of the LF voltage that matches the signal of the HF voltage, the phase signal of the HF voltage, and the reference clock, to the controller 20. As a result, a signal in which the first phase and the second phase match each other may be transmitted to the controller 20. The reference clock is a clock synchronized with the cycle of the HF. The clock may be created by dividing the frequency of the clock of the first radio-frequency power supply 6. When the clock is created by the frequency division, the sampling may be performed always at the same timing with respect to the signal of the HF voltage, the phase signal of the HF voltage, and the reference clock, even in a case where the oscillation frequency of the first radio-frequency power supply 6 shifts due to, for example, the change in temperature.

Based on the received phase signal of the LF voltage that matches the phase signal of the HF voltage and the reference clock signal, the controller 20 transmits the signal that represents the range of the second phase of the HF within the range of the first phase of the bias, to each sensor. Based on the received signal, each sensor performs the sampling in the step (c), and transmits the sensor output values of the sampling time to the controller 20.

As for the reference clock, the clock synchronized with the cycle of the bias and the clock synchronized with the cycle of the HF voltage may be set as the same clock of, for example, 400 kHz. The controller 20 may generate the reference clock.

In a case where the sensor is a CCD sensor, the CCD sensor reads the charges of a plurality of elements in an order when the reference clock is transmitted from the controller 20. In this case, the timing for reading the charge of each of the plurality of elements may not be synchronized with the cycle of the bias. Accordingly, the timing for reading the charge of each of the plurality of elements may be synchronized with a timing delayed by a given time from the timing when the sampling is performed in the step (c), or the reference clock.

As described above, according to the detecting method of the second embodiment, it is possible to improve the accuracy of a monitoring of at least one of the state of plasma, the state of a process, and the state of the plasma processing apparatus and components thereof.

The present disclosure is not limited to supplying the bias power and the source power to the lower electrode. The bias power may be supplied to the lower electrode, and the source power may be supplied to the upper electrode.

The plasma processing apparatus of the present disclosure is applicable to any type of apparatus such as an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus, and a helicon wave plasma (HWP) apparatus.

According to an aspect, it is possible to improve the accuracy of a monitoring of at least one of the state of plasma, the state of a process state, and the state of the plasma processing apparatus and components thereof.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A detecting method comprising:
supplying a bias power to a lower electrode, and a source power to an upper electrode or the lower electrode; and detecting an output value of a sensor attached to a chamber,
wherein the detecting the output value of the sensor includes:
(a) specifying a bias voltage phase of a bias waveform of the bias power for each cycle of the bias waveform;
(b) specifying an HF voltage phase of a source waveform of the source power after a predetermined first time elapses from a timing when the bias voltage phase of the bias waveform of the bias power is specified; and
(c) sampling the output value of the sensor that changes in synchronization with the bias voltage phase after a predetermined second time elapses from a timing when the HF voltage phase of the source waveform of the source power is specified, and wherein (a) to (c) are repeated for each cycle of the bias waveform.

2. A detecting method comprising:
supplying a bias power to a lower electrode, and a source power to an upper electrode or the lower electrode; and
detecting an output value of a sensor attached to a chamber,
wherein the detecting the output value of the sensor includes:
(a) specifying a bias voltage phase of a bias waveform of the bias power for each cycle of the bias waveform,
(b) specifying an HF voltage phase of a source waveform of the source power after a predetermined first time elapses from a timing when the bias voltage phase of the bias waveform of the bias power is specified, and
(c) validating sampled data of the output value of the sensor that changes in synchronization with the bias voltage phase after a predetermined second time elapses from a timing when the HF voltage phase of the source waveform of the source power is specified, and
wherein (a) to (c) are repeated for each cycle of the bias waveform.

3. The detecting method according to claim 1, wherein the detecting the output value of the sensor further includes:
(d) acquiring the output value of the sensor of a predetermined sampling time after the sampling the output value of the sensor, and
wherein (a) to (d) are repeated for each cycle of the bias waveform.

4. The detecting method according to claim 2, wherein the detecting the output value of the sensor further includes
(d) acquiring the output value of the sensor of a predetermined sampling time after the validating the sampled data of the output value of the sensor, and
wherein (a) to (d) are repeated for each cycle of the bias waveform.

5. The detecting method according to claim 1, wherein the second time is a value of 0 or more within one cycle of the bias waveform.

6. The detecting method according to claim 1, wherein the first time is a value of 0 or more within one cycle of the source waveform.

7. The detecting method according to claim 1, wherein the detecting the output value of the sensor detects a light emission intensity of a specific wavelength of plasma inside the chamber as an output value of the sensor, and detects an end point of a processing of a substrate from the output value of the sensor.

8. The detecting method according to claim 2, wherein the second time is a value of 0 or more within one cycle of the bias waveform.

9. The detecting method according to claim 2, wherein the first time is a value of 0 or more within one cycle of the source waveform.

10. The detecting method according to claim 2, wherein the detecting the output value of the sensor detects a light emission intensity of a specific wavelength of plasma inside the chamber as an output value of the sensor, and detects an end point of a processing of a substrate from the output value of the sensor.

11. A plasma processing apparatus comprising:
a bias power supply configured to supply a bias power to a lower electrode;
a source power supply configured to supply a source power to an upper electrode or the lower electrode; and
a controller configured to detect an output value of a sensor attached to a chamber,
wherein the controller controls a process including:
(a) specifying a bias voltage phase of a bias waveform of the bias power for each cycle of the bias waveform,
(b) specifying an HF voltage phase of a source waveform of the source power after a predetermined first time elapses from a timing when the bias voltage phase of the bias waveform of the bias power is specified, and
(c) sampling the output value of the sensor that changes in synchronization with the bias voltage phase after a predetermined second time elapses from a timing when the HF voltage phase of the source waveform of the source power is specified, and wherein (a) to (c) are repeated for each cycle of the bias waveform.

12. The detecting method according to claim 1, wherein the specifying the bias voltage phase of the bias waveform specifies a timing when the bias waveform changes from a negative value to a positive value as the bias voltage phase of the bias waveform for each cycle of the bias waveform.

13. The detecting method according to claim 1, wherein the specifying the HF voltage phase of the source waveform specifies a timing when the source waveform changes from a negative value to a positive value after the first time elapses from the timing when the bias voltage phase is specified, as the HF voltage phase of the source waveform.

14. The detecting method according to claim 1, wherein the specifying the bias voltage phase of the bias waveform specifies the HF voltage phase of the source waveform immediately after the predetermined first time elapses from the timing when the bias voltage phase of the bias waveform is specified.

15. The detecting method according to claim 2, wherein the validating the sampled data of the output value of the sensor calculates a moving average of the sampled data of the output value of the sensor in a cycle that corresponds to an integral multiple of the cycle of the bias waveform.

* * * * *